United States Patent [19]

Yumoto et al.

[11] Patent Number: 5,384,204
[45] Date of Patent: Jan. 24, 1995

[54] TAPE AUTOMATED BONDING IN SEMICONDUCTOR TECHNIQUE

[75] Inventors: Kazuhito Yumoto; Norio Wakabayashi; Masao Nakazawa; Shinichi Wakabayashi; Norio Wada; Fumio Kuraishi; Toshihiko Shimada, all of Nagano, Japan

[73] Assignee: Shinko Electric Industries Co. Ltd., Nagano, Japan

[21] Appl. No.: 166,620

[22] Filed: Dec. 14, 1993

Related U.S. Application Data

[63] Continuation of Ser. No. 99,051, Jul. 28, 1993, abandoned, which is a continuation of Ser. No. 735,828, Jul. 25, 1991, abandoned.

[30] Foreign Application Priority Data

Jul. 27, 1990 [JP] Japan ................. 2-200183
Jul. 27, 1990 [JP] Japan ................. 2-200184

[51] Int. Cl.⁶ ......................................... H01L 23/498
[52] U.S. Cl. ................. 428/626; 428/647; 428/670; 428/672; 428/675; 257/677
[58] Field of Search ........... 428/675, 674, 670, 677, 428/672, 673, 642, 644, 645, 647, 929, 624–626; 257/677, 672

[56] References Cited

U.S. PATENT DOCUMENTS

| | | | |
|---|---|---|---|
| 3,162,512 | 12/1964 | Robinson | 428/670 |
| 3,480,412 | 11/1969 | Duffek et al. | 428/647 |
| 3,684,464 | 8/1972 | Happ et al. | 428/614 |
| 3,781,596 | 12/1973 | Galli | 317/101 F |
| 4,000,842 | 1/1977 | Burns | 257/677 |
| 4,139,434 | 2/1979 | Dugan | 204/129.35 |
| 4,463,060 | 7/1984 | Updegraff | 428/671 |
| 4,529,667 | 7/1985 | Shiga et al. | 428/670 |
| 4,549,043 | 10/1985 | Kalubowila et al. | 428/644 |
| 4,707,724 | 11/1987 | Suzuki et al. | 427/211 |
| 4,935,312 | 6/1990 | Nakayama et al. | 428/642 |
| 5,008,997 | 4/1991 | Phy | 29/827 |

FOREIGN PATENT DOCUMENTS

| | | | |
|---|---|---|---|
| 373241 | 6/1990 | European Pat. Off. . | |
| 55-96662 | 7/1980 | Japan | 357/70 |
| 59-010252 | 1/1984 | Japan . | |
| 59-159553 | 9/1984 | Japan . | |
| 62-40753 | 2/1987 | Japan | 257/677 |
| 63-065633 | 3/1988 | Japan . | |
| 63-133539 | 6/1988 | Japan . | |
| 63-142644 | 6/1988 | Japan . | |
| 2-90661 | 3/1990 | Japan | 257/677 |
| 2222554 | 9/1990 | Japan . | |

OTHER PUBLICATIONS

"Tab Implementation and Trends" by P. Hoffman, Solid State Technology, vol. 31, No. 6, Jun. 1988, pp. 85–88, Port Washington, N.Y. USA.
Abstract for JP-51-8757, (Aug. 21, 1980).
Abstract for JP-58-139455, (Aug. 18, 1983).
Abstract for JP-60-143636, (Jul. 29, 1985).
Abstract for JP-60-147147, (Aug. 3, 1985).
Abstract for JP-62-14452, (Jan. 23, 1987).

*Primary Examiner*—John Zimmerman
*Attorney, Agent, or Firm*—Michael N. Meller

[57] ABSTRACT

A tape useful for an automatic bonding process when manufacturing a high-frequency semiconductor device, the tape comprising an insulating flexible film, and circuit patterns consisting of copper or copper-alloy formed on the insulating film, each of the circuit patterns having inner and an outer lead portions. A tin or tin-lead plated film is formed on the pattern, and an intermediate plated film is formed on at least the outer lead portion as an underlayer. The intermediate plated film consists of a metal or metal alloy selected from nickel, cobalt, gold, silver, platinum, palladium, indium or rhodium.

7 Claims, 3 Drawing Sheets

TAB TAPE WITH
WINDOW HOLES

TAB TAPE WITH
NO WINDOW HOLES

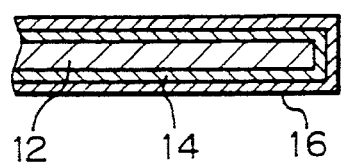
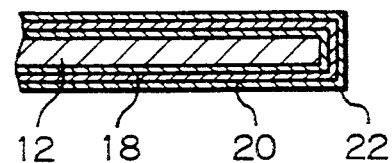
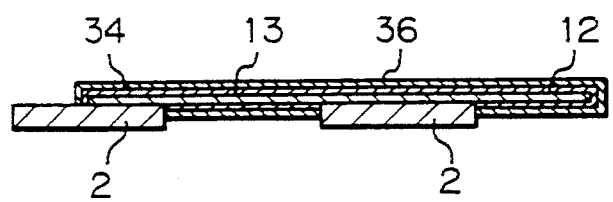
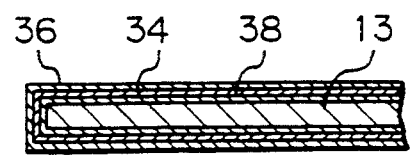
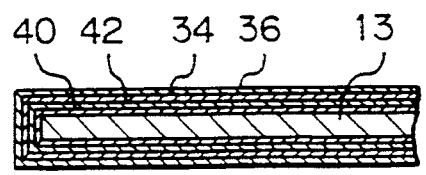

TAPE AUTOMATED BONDING IN SEMICONDUCTOR TECHNIQUE

This application is a continuation of application Ser. No. 099,051, filed Jul. 28, 1993, now abandoned which is a continuation of application Ser. No. 07/735,828, filed Jul. 25, 1991, now abandoned.

BACKGROUND OF THE INVENTION

1. Field of the Invention

This invention relates to a high-frequency semiconductor technique, and more particularly, to a tape automated bonding tape or tape-like carrier (hereinafter referred to simply as "TAB tape") used to connect electrodes of a semiconductor device operating in a high frequency range, and circuit patterns formed on a ceramic board or printed board on which such a semiconductor device is mounted.

2. Description of the Related Art

A TAB tape comprises an insulation film made of, for example, a polyimide film strip having a number of longitudinal segments each provided with a plurality of conductive metalic circuit patterns formed of, for example, copper foil, electroplated with gold or the like. Such a TAB tape is more useful than a conventional wire-bonding, for a multi-pin semiconductor device.

Inner leads of the metalic patterns of the TAB tape are connected to respective electrodes or bumps made of, for example, gold or the like, and formed on the semiconductor chip, by an Au-Sn (gold-tin) eutectic alloy. Thus, a tin-plated film is usually formed on the respective lead patterns, made of copper foil, on the TAB tape, and such a tin-plated film is also formed on respective outer leads of the TAB tape, which are connected to outside electrical circuits.

Nevertheless, a known TAB tape as mentioned above has the following problems.

When the inner leads of the TAB tape are connected to the semiconductor chip by an Au-Sn (gold-tin) eutectic alloy, a high temperature bonding condition of 400° C. to 500° C. is generally required. Such a high temperature generated in the inner leads is immediately transmitted to the outer leads of the TAB tape, whereby the outer to the outer leads of the TAB tape, whereby the outer leads are heated, and thus the copper of the outer leads may be diffused into the tin-plated layer, and accordingly, the tin-plated layer is no longer effective. Therefore, the bonding efficiency between the outer leads and the outside electrical circuits would be adversely affected by such a diffusion of copper into the tin-plated layer.

Even if the outer leads are temporarily connected to the outside electrical circuits, the copper in the outer leads may be gradually diffused into the tin-plated layer in such a time since copper inherently has a characteristic of being easily diffused into tin. Therefore, the strength of the solder bonding may be weakened, and therefore, the soldered portions easily peeled off.

If a thickness of the tin-plated layer is increased, the above-mentioned problems may be overcome to a certain extent, but in this case, when the inner leads of the TAB tape are connected to the semiconductor chip by an Au-Sn (gold-tin) eutectic alloy, an excess amount of tin may flow to thereby cause a short circuit between adjacent inner leads. Therefore, the tin-plated layer must be thin, i.e., have a thickness thereof of approximately 0.5 μm.

On the other hand, when the inner leads of the TAB tape are connected to the semiconductor chip, a bonding tool is used to urge the inner leads toward the bumps of the semiconductor chip, and as a melting solder of tin may be attached to the bonding tool the bonding tool must be frequently cleaned. This can lead to a state, wherein such a bonding tool becomes no longer useful as a bonding tool.

In addition, the tin-plated film is readily deteriorated over a long time, due to, for example, an oxidization of the surface of the tin-plated film. Therefore, when the inner leads of the TAB tape are connected to the semiconductor chip by an Au-Sn (gold-tin) eutectic alloy, a favorable meniscus due to the gold-tin eutectic alloy can not be obtained. Also, the tin-plated film develops very thin needle-like whiskers or the like, which sometimes cause a short circuit between the densely arranged leads of the conductive circuit patterns.

SUMMARY OF THE INVENTION

An object of the present invention is to provide an improved TAB tape in which a diffusion of the copper of the outer leads into the tin-plated layer is prevented to thus increase the bonding efficiency between the outer leads and the outside electrical circuits.

Another object of the present invention is to provide an improved TAB tape in which an attaching of the soldering material, for example tin (Sn), to the bonding tool is prevented.

Still another object of the present invention is to provide an improved TAB tape in which a deterioration of the tin-plated film due to, for example, an oxidization of the surface of the tin-plated film is prevented.

A further object of the present invention is to provide an improved TAB tape in which the tin-plated film can be prevented from developing whiskers or the like, which may cause a short circuit between the leads of the conductive circuit patterns.

According to this invention, there is provided a tape useful for an automatic bonding process when manufacturing a high-frequency semiconductor devices, said tape comprising: an electrically insulating flexible film; a plurality of electrically conductive circuit patterns consisting of copper or copper-alloy formed on said insulating film; each of said circuit patterns having an inner lead portion and an outer lead portion; a solder plated film, such as tin or tin-lead plated film, formed on at least said inner and outer lead portions of the respective circuit pattern; characterized in that; said tape further comprise:

an intermediate plated film formed on at least said outer lead portion as an underlayer of said solder plated film, and said intermediate plated film consisting of a metal or metal alloy selected from nickel, cobalt, gold, silver, platinum, palladium, indium or rhodium.

According to another aspect of this invention, there is provided a tape useful for an automatic bonding process when manufacturing a high-frequency semiconductor devices, said tape comprising: an electrically insulating flexible film; a plurality of electrically conductive circuit patterns consisting of copper or copper-alloy formed on said insulating film; each of said circuit patterns having an inner lead portion and an outer lead portion; a solder plated film, such as tin or tin-lead plated film, formed on at least said inner and outer lead portions of the respective circuit pattern; characterized in that; said tape further comprises:

a first plated film and a second plated film being formed on at least said outer lead portion as underlayers of said solder plated film;

said first plated film formed on said circuit pattern consisting of a metal or metal alloy selected from nickel, cobalt, tin-nickel alloy, tin-cobalt alloy, nickel-cobalt alloy, or tin-nickel-cobalt alloy; and said second plated film formed on said first plated film consisting of a metal or metal alloy selected from gold, silver, platinum, palladium, indium or rhodium.

With this invention as mentioned above, even at a high temperature of, for example, 400° to 500° C., a diffusion of the copper material of the outer leads into the tin-plated layer is prevented, since there is an intermediate, underlayer between the copper material of circuit pattern and the solder (tin) plated film, and thus the bonding efficiency of the outer leads and the outside electrical circuits is improved.

According to still another aspect of this invention, there is provided a tape useful for an automatic bonding process when manufacturing a high-frequency semiconductor devices, said tape comprising: an electrically insulating flexible film; a plurality of electrically conductive circuit patterns consisting of copper or copper-alloy formed on said insulating film; each of said circuit patterns having an inner lead portion and an outer lead portion; a solder plated film, such as tin or tin-lead plated film, formed on at least said inner and outer lead portions of the respective circuit pattern; characterized in that; said tape further comprised:

a metal plated film consisting of gold or indium formed to cover said solder plated film on the circuit pattern.

In the above-mentioned tape useful for an automatic bonding process, an intermediate plated film is formed on at least said outer lead portion as an underlayer of said solder plated film, and said intermediate plated film consists of a metal or metal alloy selected from nickel, cobalt, gold, silver, platinum, palladium, indium or rhodium.

With the invention as mentioned above, a deterioration of the tin-plated film due to an oxidization of the surface thereof, and further a developing of whiskers or the like can be prevented, since the gold or indium plate film is provided for covering the solder (tin) plated film on the circuit pattern.

BRIEF DESCRIPTION OF THE DRAWINGS

FIG. 3 is an enlarged cross-sectional view of an outer lead and illustrates an embodiment of this invention.

FIG. 4 is a cross-sectional view of a modified embodiment of the outer lead shown in FIG. 3.

FIG. 5 is a cross-sectional view of another embodiment of the outer lead according to this invention.

FIG. 6 is a cross-sectional view of a modified embodiment of the outer lead shown in FIG. 5.

FIG. 7 is a cross-sectional view of another modified embodiment of the outer lead shown in FIG. 5.

DESCRIPTION OF THE PREFERRED EMBODIMENTS

Figure 1A:
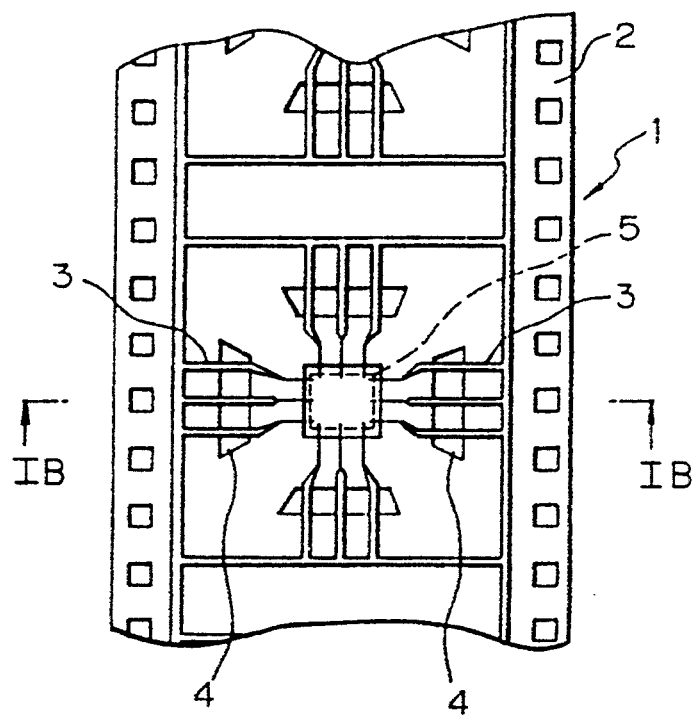
FIG. 1A is a plan view of a TAB tape having window holes and FIG. 1B is a cross-sectional view taken along IB—IB in FIG. 1A.
Figure 1B:
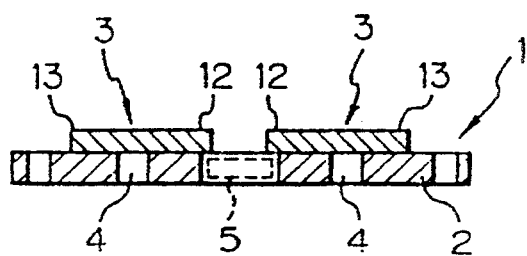
Figure 2A:
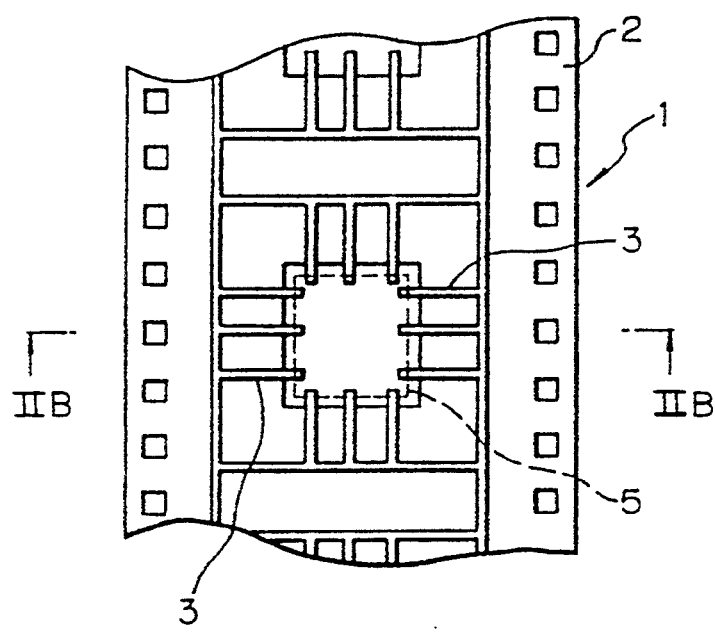
FIG. 2A is a plan view of a TAB tape having no window holes.
Figure 2B:
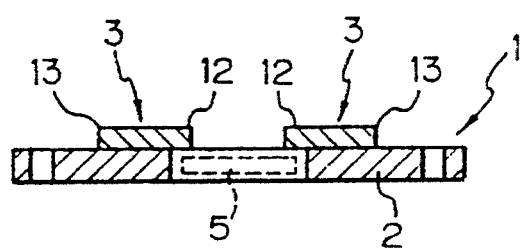
FIG. 2B is a cross-sectional view taken along IIB—IIB in FIG. 2A.

Referring now to the drawings, wherein FIGS. 1A, 1B, 2A and 2B show a TAB tape according to the present invention, as generally indicated by a reference numeral 1, this TAB tape comprises an electrically insulating flexible film 2 made of, for example, a polyamide strip film having a series of substantially rectangular segments spaced continuously in the longitudinal direction, each segment being provided with electrically conductive circuit patterns 3 consisting of a suitable metal, such as copper foil, which are electroplated with gold or the like in order to protect these patterns from corrision and to make it easier to perform a subsequent bonding process. Reference numeral 4 indicates a window hole and 5 indicates a semiconductor chip.

This TAB tape 1 can be made as follows. First, an insulating film tape is punched and have substantially rectangular segments spaced continuous and next a copper foil strip, or a copper material, or a copper-alloy is adhered to a surface of an insulating film tape 2, the copper foil layer thus formed on the surface of the film 2 is then etched to define a plurality of connecting circuit patterns 3, and thus each of the conductive patterns 3 has a portion of an inner lead 12 and a portion of an outer lead 13.

As shown in FIG. 3, a TAB tape according to the first embodiment of this invention comprises a plurality of connecting circuit patterns 3 each comprising a copper foil on which a tin-plated film 16 is formed via an intermediate plated-film 14.

The intermediate plated-film 14 must be selected from a metal material that will not become alloyed with the upper, tin(Sn)-plated film 16, and will not reduce the bonding or soldering efficiency due to such an alloying, even under a high temperature of 400° C. to 500° C. when the inner leads of the TAB tape are connected to the semiconductor chip. Thus, such a metal material may be a precious metal film, for example, gold (Au), silver (Ag), platinum (Pt), palladium (Pd), indium (In) or rhodium (Rh), or nickel (Ni) or cobalt (Co) film.

If such a plated-film 14 is directly plated on to the copper foil and if such a plated-film 14 does not have a sufficient thickness, the copper material still may be diffused into the plated-film 14, and thus the plated-film 14 must have a sufficient thickness to prevent the copper material from diffusion into the tin (Sn) plated-film 16 even under the above-mentioned high temperature condition.

The above-mentioned plated-film 14, i.e., the underlayer of the tin-plated film 16 should be formed at least on the outer lead. Also, preferably the tin-plated film 16 is formed on one of the surfaces of the inner lead, which should be abutted against the semiconductor chip.

A TAB tape according to a second embodiment of this invention comprises, as shown in FIG. 4, a plurality of connecting circuit patterns 3 each comprising a copper foil, on which a tin-plated film 22 is plated on a first plated-film 18 and a second plated-film 20.

The first plated-film 18 must be selected from a metal material such that the basic copper material will not be diffused there, even under a high temperature of 400° C. to 500° C. when the inner leads of the TAB tape are connected to the semiconductor chip. Thus, such a metal material of the first plated-film 18 may be selected from a nickel or cobalt film, or a metal film of tin-nickel alloy, tin-cobalt alloy, nickel-cobalt alloy, or tin-nickel-cobalt alloy.

To prevent an alloying of the first plated-film 18 with the upper, an intermediate, second plated-film 20 is formed between the first plated-film 18 and tin-plated film 22. The second plated film 20 must be selected from a metal material such that it will not be alloyed with the lower, first plated-film 18 or the upper, tin(sn)-plated film 22, and will not reduce the bonding or soldering efficiency due to such an alloying even under the above-mentioned high temperature. Thus, such a metal material may be a precious metal film, for example gold (Au), silver (Ag), platinum (Pt), palladium (Pd) indium (In) or rhodium (Rh).

The above-mentioned first plated-film 18, i.e., the underlayer of the tin-plated film 22 and the second plated-film 20, should be formed at least on the outer lead. Also, preferably the tin-plated film 22 is formed on one of the surfaces of the inner lead, which should be abutted against the semiconductor chip.

Although the above-mentioned tin-plated film 16 or 22 can be formed by an electrolessplating process if directly plated on the copper foil as in the prior art, in the present invention, such a film must be formed by an electroplating process as the electrolessplating cannot be adopted due to the existence of an underlayer of precious metal.

In place of the tin-plated film 16 or 22, a tin-lead solder film also can be used. In this case, the copper material is also prevented from diffusing into the tin-lead solder film, to thus increase the bonding efficiency.

Although the thicknesses of the respective layers or films are not limited, preferably, in FIG. 3, the plated layer 14 is 0.1 to 3.0 μm thick, and in FIG. 4, the first plated layer 18 is 0.1 to 1.5 μm thick and the second plated layer 20 is 0.01 to 1.0 μm thick. Also, preferably the tin-plated solder film 16 or 22 or the tin-lead solder film is not more than 1.5 μm, to prevent a flow out of the solder film when the semiconductor chip is connected by a die-bonding process.

Some experimental results of the embodiments according to the present invention will now be described.

FIRST EMBODIMENT

TAB tape samples of a first comparative reference and a first embodiment were made. The first comparative reference was a tin-plated film 0.5 μm thick and formed directly on to a copper foil. The first embodiment was an intermediate silver-plated film 1.0 μm thick and formed on a copper foil and a tin-plated film 0.5 μm thick then formed thereon. The respective samples were heated at 220° C. for one hour and dipped in a liquid solder at 250° C. The soldering characteristics in these samples were examined by a soldering checker, and the data thus obtained are shown in Table 1. The wetting stress was a value obtained after 7 second.

TABLE 1

|  | Wetting Time | Wetting Stress | Wetting Ratio |
| --- | --- | --- | --- |
| 1st Comparative Reference | 7.6 sec. | −0.2 g | 30% |
| 1st Embodiment | 3.5 sec. | 1.3 g | 100% |

As clearly understood from TABLE 1, according to the first embodiment, a much higher solder bonding efficiency can be obtained compared with the first comparative reference.

In this first embodiment, in place of the above-mentioned silver-plated film, a plated film of nickel (Ni), cobalt (Co), gold (Au), platinum (Pt), indium (In) or rhodium (Rh) was also examined, and a similar solder bonding efficiency was obtained.

SECOND EMBODIMENT

Samples of TAB tape of a second comparative reference and a second embodiment were made. The second comparative reference was a tin-plated film 0.5 μm thick and formed directly on a copper foil. The second embodiment was a first, nickel-plated film 0.5 μm thick formed on a copper foil, and a second, platinum-plated film 0.1 μm thick formed thereon, and then a tin-plated film 0.5 μm thick further formed thereon. The respective samples TAB tape were heated at 500° C. for two seconds and dipped in a liquid solder at 250° C. Similar to the above, the soldering characteristics in these samples were examined by a soldering checker, and the data thus obtained are shown in TABLE 2.

TABLE 2

|  | Wetting Time | Wetting Stress | Wetting Ratio |
| --- | --- | --- | --- |
| 2nd Comparative Reference | 3.5 sec. | 1.5 g | 80% |
| 2nd Embodiment | 1.9 sec. | 2.1 g | 100% |

As clearly understood from TABLE 2, according to the second embodiment, a much higher solder bonding efficiency can obtained compared with the second comparative reference.

In the second embodiment, a first, cobalt-plated film was used in place of the above-mentioned nickel-plated film and a second-plated film of gold, silver, platinum, indium or rhodium was used in place of the above-mentioned platinum-plated film. In this case, a similar solder bonding efficiency was obtained.

THIRD EMBODIMENT

A third comparative reference was a tin-plated film 0.5 μm thick formed directly on a copper foil. A third embodiment was a first, tin-nickel-plated film 0.5 μm thick formed on a copper foil, a second, gold-plated film 0.1 μm thick formed thereon, and a tin-plated film 0.5 μm thick further formed thereon. The respective samples of TAB tape were heated at 220° C. for one hour and dipped in a liquid solder at the temperature of 250° C. Similar to the above, the soldering characteristics in these samples were examined by a soldering checker, and the data thus obtained are shown in TABLE 3.

TABLE 3

|  | Wetting Time | Wetting Stress | Wetting Ratio |
| --- | --- | --- | --- |
| 3rd Comparative Reference | 7.6 sec. | −0.2 g | 30% |
| 3rd Embodiment | 4.5 sec. | 1.4 g | 100% |

As clearly understood from TABLE 3, according to the third embodiment a much higher solder bonding efficiency was obtained compared with the third comparative reference.

In the third embodiment, a first plated film of thin-cobalt alloy, nickel-cobalt alloy, tin-nickel-cobalt alloy was used in place of the above-mentioned tin-nickel alloy plated film, and a second-plated film of silver, platinum indium or rhodium was used in place of the above-mentioned gold-plated film. In this case, a similar solder bonding efficiency was obtained.

In the above embodiments, a tin-lead alloy solder film was also used in place of the tin-plated film, and in this case, a similar solder bonding efficiency was obtained.

In the respective embodiments, tin-plated film was formed on only one of the surfaces of the inner lead of the TAB tape, which should be abutted against the semiconductor chip, but was not formed on the other surfaces of the inner lead which should face a bonding tool. In this case, the soldering material of tin or tin-lead alloy was not attached to the bonding tool, and thus a bonding of the inner leads could be efficiently conducted.

FIG. 5 shows another embodiment of a TAB tape according to this invention, which comprises a plurality of connecting circuit patterns each comprising a copper foil having an inner lead portion 12 and an outer lead portion 13. On these inner and outer lead portions 12 and 13 is formed a tin-plated film 34, and a gold-plated film 36 is formed on the tin-plated film 34.

Thus, according to this embodiment, the tin-plated film 34 is covered with a gold-plated film 36, and therefore, a deterioration of the tin-plated film 34 is prevented due to, e.g., an oxidization thereof, and the tin-plated film 34 is prevented from developing whiskers or the like. Therefore, as the gold-plated film 36 is so stable, an effective soldering or bonding efficiency can be obtained.

When the inner leads 12 of the TAB tape are connected to the semiconductor chip, such a connection is carried out by an Au-Sn (gold-tin) eutectic alloy between the tin-plated films 34 formed on the inner leads 12 and the gold bumps formed on the semiconductor chip. The gold-plated film 36 must have a thickness such that an gold-tin eutectic alloying is not prevented thereby. Namely, if the thickness of the gold-plated film 36 is too large, the gold-tin eutectic alloy cannot be formed. In such a situation, the gold-plated film 36 must be abutted against the gold bumps of the semiconductor chip by a heat-pressure contact, and therefore, a connection at a low temperature cannot be expected. Thus, preferably the thickness of the gold-plated film 36 is 0.01 to 0.5 μm, and preferably, the thickness of the tin-plated film 14 is 0.3 to 1.0 μm, which should be sufficient for forming a Au-Sn (gold-tin) eutectic alloy.

In this embodiment, the tin-plated film 34 is covered with the gold-plated film 36, which serves as a protective film, and a part of the gold when a boding a gold-tin eutectic alloy is conducted.

When the outer leads 13 of the TAB tape are connected to the outside conductive circuit, such a connection is also carried out by an gold-tin eutectic alloy between the tin-plated films 34 formed on the outer leads 13 and the gold-plated film 36 on the outside conductive circuit. In this case, the gold-plated film 36 on the outer lead 13 must have a thickness such that an gold-tin eutectic alloying is not prevented thereby.

The connection between the outer leads and the outside conductive circuit also can be effected by a tin-lead solder or the like. In this case, since the outer lead is also covered with the gold-plated film 36, the tin-plated film 34 is prevented from developing whiskers or the like.

Preferably the above-mentioned tin-plated film 34 on the inner lead 12 is formed on only one of the surfaces of the inner lead 12, which should be abutted against the semiconductor chip. In this case, when the inner lead 12 is pressed against the bonding tool, to bond it with the semiconductor chip, the soldering material, i.e., the melted gold-tin, cannot be attached to the bonding tool, and thus an effective bonding can be carried out.

FIG. 6 shows another modified embodiment of a TAB tape of this invention, which comprises an intermediate, barrier plated-film 38 formed on at least the outer leads 13. Such a barrier plated-film 38 serves as an underlayer of the tin-plated film 34.

The intermediate plated-film 38 must be selected from a metal material such that it will not be alloyed with the upper, tin-plated film 34, and thus the bonding or soldering efficiency will not be lowered due to such an alloying, even under high temperature of 400° C. to 500° C. when the inner leads of the TAB tape are Connected to the semiconductor chip. Thus, such a metal material may be a precious metal film, for example gold (Au), silver (Ag), platinum (Pt), palladium (Pd), indium (In) or rhodium (Rh), or nickel (Ni) or cobalt (Co) film.

If such a plated-film 38 is directly plated on the copper foil, and if such a plate-film 38 does not have a sufficient thickness, the copper material still may be diffused into the plated-film 38. Thus, the plated-film 38 must have a sufficient thickness that will prevent a diffusion of the copper material into the plated-film 34 even under the above-mentioned high temperature condition.

FIG. 7 shows a further embodiment of a TAB tape of this invention, which comprises a plurality of connecting circuit patterns 3 each comprising a copper foil having an inner leads 12 and an outer lead 13. A first plated-film 40 and a second plated-film 42 are formed at least on the outer leads 13 as underlayers of the tin-plated film 34.

The first plated-film 40 must be selected from a metal material such that a diffusion of the basic copper material there in is prevented even under a high temperature of 400° C. to 500° C. when the inner leads of the TAB tape are connected to the semiconductor chip. Thus such a metal material of the first plated-film 40 may be selected from nickel or cobalt film, or a metal film of tin-nickel alloy, tin-cobalt alloy, nickel-cobalt alloy, or tin-nickel-cobalt alloy.

To prevent an alloying of the first plated-film 40 with the upper, an intermediate, second plated-film 42 is formed between the first plated-film 40 and tin-plated film 34. The second plated-film 42 must be selected from a metal material such that it will not be alloyed with the lower, first plated-film 40, or the upper, tin-plated film 34 and will not reduce the bonding or soldering efficiency due to such an alloying, even under the above-mentioned high temperature. Thus, such a metal material may be a precious metal film, for example, gold (Au), silver (Ag), platinum (Pt), palladium (Pd) indium (In) or rhodium (Rh).

Preferably, in FIG. 7, the first plated layer 40 is 0.1 to 1.5 μm thick and the second plated layer 42 is 0.01 to 1.0 μm thick.

In the embodiments shown in FIGS. 5, 6 and 7, an indium (In) plated film also can be formed in place of the gold (Au) plated film 36. In this case, the same results can be obtained as with the gold (Au) plated film 36.

Although the above-mentioned tin-plated film 34 can be formed by an electrolessplating process if directly plated on the copper foil as in the prior art, in the present invention such a film must be formed by an electroplating process since the electrolessplating cannot be adopted due to the existence of an underlayer of precious metal.

In place of the tin-plated film 34, a tin-lead solder film also can be used. In this case, the copper material is also prevented from diffusing into the tin-lead solder film, to thus increase the bonding efficiency.

Although preferred embodiments of this invention are described above with reference to the drawings, it should be understood that the scope of the present invention is not limited to such embodiments, and that any other variations or modifications can be made within the scope or spirit of this invention as claimed in the attached claims.

We claim:

1. A tape useful for an automatic bonding process when manufacturing a high-frequency semiconductor device, said tape comprising: an electrically insulating flexible film; a plurality of electrically conductive circuit patterns consisting of copper or copper-alloy formed on said insulating film; each of said circuit patterns having an inner lead portion and an outer lead portion; a solder plated film, consisting of tin or tin-lead plated film, formed on said inner and outer lead portions of the respective circuit pattern;

a first plated film and a second plated film formed on at least said outer lead portion as underlayers of said solder formed film;

said first plated film formed on said circuit pattern consisting essentially of nickel; and said second plated film formed on said first plated film consisting of gold and/or palladium.

2. A tape as set forth in claim 1, wherein said inner lead portion of the circuit pattern has respective surfaces and said solder plated film is formed on one of said surfaces which is to be abutted against a semiconductor device.

3. A tape as set forth in claim 1, wherein said inner lead portion of the circuit pattern has a tip which protrudes from said insulating flexible film.

4. A tape as set forth in claim 1, wherein said first plated layer has a thickness of 0.1 to 1.5 $\mu$m and the second plated layer has a thickness of 0.01 to 1.0 $\mu$m.

5. A tape as set forth in claim 1, wherein a thickness of said solder-plated film is not more than 1.5 $\mu$m.

6. A tape as set forth in claim 1, wherein said tape further comprises:

a metal plated film consisting of gold or indium formed to cover said solder plated film on the circuit pattern.

7. A tape as set forth in claim 6, wherein a thickness of said gold or indium plated film is 0.01 to 0.5 $\mu$m.

* * * * *